(12) United States Patent
Lee et al.

(10) Patent No.: US 7,994,831 B2
(45) Date of Patent: Aug. 9, 2011

(54) SEMICONDUCTOR INTEGRATED CIRCUIT AND METHOD OF CONTROLLING THE SAME

(75) Inventors: Hyun-Woo Lee, Ichon (KR); Won-Joo Yun, Ichon (KR)

(73) Assignee: Hynix Semiconductor Inc. (KR)

( * ) Notice: Subject to any disclaimer, the term of this patent is extended or adjusted under 35 U.S.C. 154(b) by 79 days.

(21) Appl. No.: 12/176,217

(22) Filed: Jul. 18, 2008

(65) Prior Publication Data

US 2009/0174447 A1 Jul. 9, 2009

(30) Foreign Application Priority Data

Jan. 7, 2008 (KR) .................... 10-2008-0001582

(51) Int. Cl.
*H03L 7/06* (2006.01)
(52) U.S. Cl. .................... 327/158; 327/149
(58) Field of Classification Search .................. 327/149, 327/158
See application file for complete search history.

(56) References Cited

U.S. PATENT DOCUMENTS

| | | | |
|---|---|---|---|
| 6,088,255 A * | 7/2000 | Matsuzaki et al. | 365/76 |
| 6,265,918 B1 * | 7/2001 | Toda | 327/146 |
| 6,266,294 B1 * | 7/2001 | Yada et al. | 365/233.14 |
| 6,483,359 B2 | 11/2002 | Lee | |
| 6,650,594 B1 * | 11/2003 | Lee et al. | 365/233.15 |
| 6,822,494 B2 | 11/2004 | Kim | |
| 6,853,226 B2 | 2/2005 | Kwak et al. | |
| 6,943,602 B1 | 9/2005 | Lee | |
| 7,088,156 B2 * | 8/2006 | Kim | 327/149 |
| 7,327,173 B2 * | 2/2008 | Kim | 327/149 |
| 7,372,311 B2 | 5/2008 | Kang | |
| 7,388,415 B2 * | 6/2008 | Lee | 327/158 |
| 7,489,172 B2 * | 2/2009 | Kim | 327/160 |
| 7,501,866 B2 * | 3/2009 | Choi | 327/156 |
| 7,545,189 B2 * | 6/2009 | Ku | 327/158 |
| 2007/0152723 A1 | 7/2007 | Ahn et al. | |
| 2007/0188206 A1 * | 8/2007 | Lee | 327/158 |
| 2007/0263460 A1 * | 11/2007 | Jang | 365/194 |
| 2008/0204095 A1 * | 8/2008 | Cho | 327/158 |
| 2009/0015302 A1 * | 1/2009 | You | 327/158 |
| 2009/0121784 A1 * | 5/2009 | Lee et al. | 327/544 |
| 2009/0153186 A1 * | 6/2009 | Oh et al. | 326/30 |
| 2009/0201751 A1 * | 8/2009 | Hayashi | 365/194 |

FOREIGN PATENT DOCUMENTS

| | | |
|---|---|---|
| JP | 2005-020686 | 1/2005 |
| KR | 1020070036547 | 4/2007 |
| KR | 1020070036548 | 4/2007 |
| KR | 1020070036561 | 4/2007 |
| KR | 1020080088158 | 10/2008 |

* cited by examiner

*Primary Examiner* — Lincoln Donovan
*Assistant Examiner* — Adam D Houston
(74) *Attorney, Agent, or Firm* — Baker & McKenzie LLP

(57) ABSTRACT

A semiconductor integrated circuit is disclosed. The disclosed semiconductor integrated circuit of the present invention includes a DLL (Delay Locked Loop) controller that controls whether to activate a DLL at the entry of a power down mode, in response to a result of detecting whether a range of phase change of an external clock signal is within a predetermined range, and a DLL block that provides a result of comparing a reference clock signal with a feedback clock signal to the DLL controller and also provides a delay locked clock signal that is periodically updated, in response to the reference clock signal, under the control of an activated output signal from the DLL controller.

14 Claims, 4 Drawing Sheets

① SMALL PHASE DIFFERENCE BETWEEN refCLK AND fbCLK

② LARGE PHASE DIFFERENCE BETWEEN refCLK AND fbCLK

SEMICONDUCTOR INTEGRATED CIRCUIT AND METHOD OF CONTROLLING THE SAME

CROSS-REFERENCES TO RELATED APPLICATION

The present application claims priority under 35 U.S.C. 119(a) to Korean application number 10-2008-0001582, filed on Jan. 7 2008, in the Korean Intellectual Property Office, which is incorporated by reference in its entirety as if set forth in full.

BACKGROUND

1. Technical Field

The embodiments described herein relate to a semiconductor integrated circuit and a method of controlling the semiconductor integrated circuit, particularly a semiconductor integrated circuit including a DLL circuit and a method of controlling the semiconductor integrated circuit.

2. Related Art

Generally, in a conventional semiconductor integrated circuit, a timing skew is generated between a clock signal transmitted from outside the circuit and a clock signal provided inside the circuit. Therefore, a circuit that accurately synchronizes data with a clock signal is required. A delay locked loop (hereafter, referred to as 'DLL') has been commonly used as a synchronization circuit. The DLL is a circuit that generates a locked internal clock signal by delaying an external clock signal.

A power down mode is often applied to a conventional semiconductor integrated circuit to reduce current consumption; however, internal circuits within such a semiconductor integrated circuit may operate unstably due to changes in voltage and internal temperature at the entry or end of the power down mode. Accordingly, the DLL receives an external clock signal even in the power down mode such that a DLL output clock signal is periodically updated even in the power down mode. When the frequency of the external clock signal is changed or not appropriately transmitted by the power down mode, wrong information from the external clock signal is updated in the DLL circuit, thereby causing errors in the operation of the inner circuits.

SUMMARY

A semiconductor integrated circuit including a DLL circuit that can be configured to detect an error of an external clock and a method of controlling the semiconductor integrated circuit is described herein.

According to one aspect, a semiconductor integrated circuit comprises a DLL controller that controls whether to activate a DLL at the entry of a power down mode, in response to a result of detecting whether a range of phase change of an external clock signal is within a predetermined range, and a DLL block that provides a result from comparing a reference clock signal with a feedback clock signal to the DLL controller and also provides a delay locked clock signal that can be periodically updated, in response to the reference clock signal, under the control of an activated output signal from the DLL controller.

According to another aspect, a semiconductor integrated circuit comprises a DLL controller that receives a clock cycle transition signal and is configured to detect a range of phase change of an external clock signal at the entry of a power down mode, and to provide an activating signal, and a DLL block that generates the clock cycle transition detecting signal by comparing a phase difference of the signals obtained by delaying for a predetermined time a reference clock signal buffered from the external clock signal and a feedback clock signal obtained by delaying the external clock signal for each clock signal, and provides a delay locked clock signal that can be periodically updated in response to the external clock signal according to the level of the DLL activating signal.

According to still another aspect, a method of controlling a semiconductor integrated circuit includes generating a reference clock signal obtained by buffering an external clock signal and a feedback clock signal that can be obtained by delaying the external clock signal for each clock signal at the entry of a power down mode, generating a delayed reference clock signal and a delayed feedback clock signal by delaying the reference clock signal and the feedback clock signal, respectively, for a predetermined time, comparing whether a phase difference of the external clock signal has a cycle signal within a predetermined allowable range by detecting phase differences of the reference clock signal, the feedback clock signal, the delayed reference clock signal, and the delayed feedback clock signal, and determining whether to provide a delay lock clock signal that can be periodically updated, in response to the external clock signal according to the compared result.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiments described herein, a semiconductor integrated circuit that controls the update of a DLL circuit when an error of an external clock signal is detected in a power down mode is provided. That is, a phase comparing part can be provided and can be configured to compare phase differences of a reference clock signal and a feedback clock signal by delaying the clock signals for a predetermined time and to stop updating the DLL circuit when an error is detected from the cycle of the external clock signal. Therefore, it is possible to improve the stability of an operation of an inner circuit by appropriately controlling the update, depending on the changes of the external clock signal, when periodically updating the DLL circuit in the power down mode.

Figure 1:
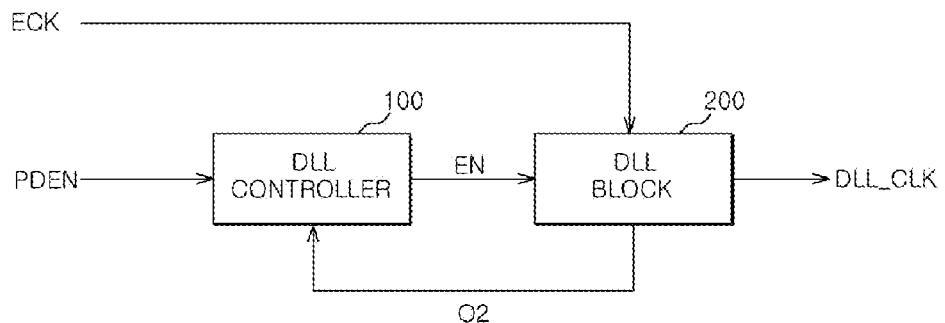
FIG. 1 is a conceptual block diagram of a semiconductor integrated circuit according to one embodiment.

FIG. 1 is a block diagram of a semiconductor integrated circuit including a DLL circuit according to one embodiment. Referring to FIG. 1 the semiconductor integrated circuit includes a DLL controller 100 and a DLL block 200.

The DLL controller 100 according to one embodiment can be configured to generate a DLL activating signal 'EN' in response to a power down mode start signal 'PDEN' and a clock cycle transition detecting signal '02'. In detail, when entering the power down mode, the DLL controller 100 controls whether to activate the DLL block 200, on the basis of the level of the clock signal cycle transition detecting signal '02' generated from the DLL block 200. For example, an activated high-level DLL activating signal 'EN' can activate the DLL block 200.

The DLL block 200 can receive a DLL activating signal 'EN' and an external clock signal 'ECK' and to generate a delay locked clock signal 'DLL_CLK'. That is, the DLL block 200 can generate the delay locked clock signal 'DLL_CLK' that responds to the external clock signal 'ECK', depending on the level of the DLL activating signal 'EN'. The DLL block 200, specifically, can be configured to compare the phase differences of the delayed clock signals that are generated by delaying a fed-back clock signal and a reference clock signal (not shown) for a predetermined time and then to generate the clock cycle transition detecting signal '02' for detecting changes of the external clock signal 'ECK'. The clock cycle transition detecting signal '02' can be fed back to the DLL controller 100 and it can be used to determine whether to activate the DLL block 200 depending on the result.

Figure 2:
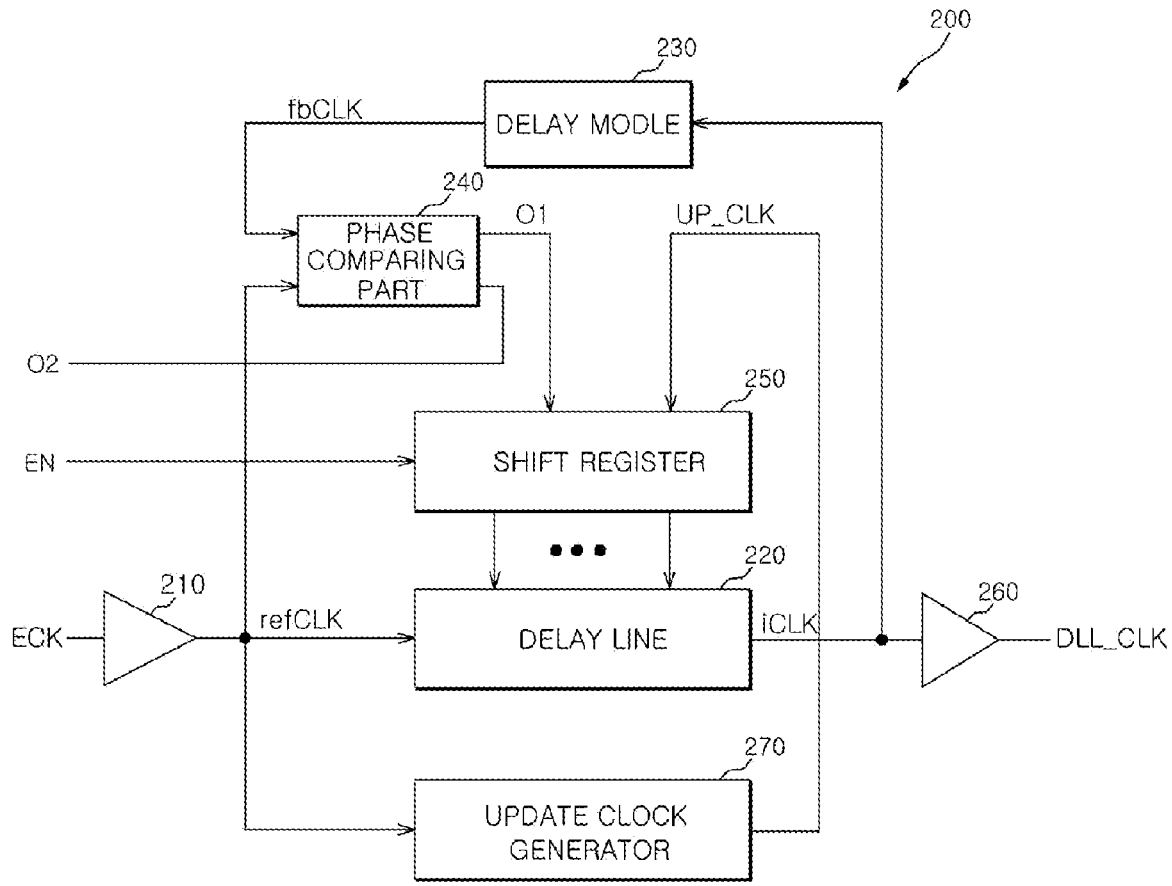
FIG. 2 is a block diagram illustrating in detail the DLL block included in the block diagram of a semiconductor integrated circuit of FIG. 1.

FIG. 2 is a block diagram of the DLL block 200 shown in FIG. 1. Referring to FIG. 2, the DLL block 200 can be configured to include a reference clock generator 210, a delay line 220, a delay model 230, a phase comparing part 240, a shift register 250, a buffer 260, and an update clock generator 270.

The DLL block 200 can be, according to one embodiment, a digital type DLL circuit. For purposed of illustration, it will be assumed that DLL 200 is a digital DLL in the descriptions that follow. Further, the reference clock generator 210, delay line 220, and delay model 230, other than the phase comparing part 240, are common DLL circuits, which are known and will not be described in detail herein.

First, the reference clock generator 210 can be configured to receive an external clock signal 'ECK' and generate a reference clock signal 'refCLK'. For the convenience, one reference clock signal 'refCLK' is shown in the figure, but two reference clock signals can be provided, which are respectively generated in synchronization with the rising edge and the falling edge of the outer clock signal 'ECK', depending on the operational scheme of the circuit. That is, the above reference clock signal 'refCLK' can be a clock signal that is not delayed before passing the delay line 220, such that it can be considered as a signal having the same cycle as the external clock signal 'ECK'. Therefore, it should be understood that the reference clock signal 'refCLK' implements an external clock signal 'ECK' hereafter.

The delay line 220 can be configured to generate an internal circuit clock signal 'iCLK' by adjusting a delay time of the reference clock signal 'refCLK'. The delay line 220, for example, can be implemented in variety of ways, such as a plurality of inverter chains that can be connected in a series or a NAND gate logic, to name just a few options.

The delay model 230 can be configured to receive an internal circuit clock signal 'iCLK' and generate a feedback clock signal 'fbCLK' by delaying the internal circuit clock signal 'iCLK' under the same delay conditions as the substantial external clock signal 'ECK'. For example, the delay model 230 can be a kind of replica circuit that includes a dummy clock buffer, a dummy output buffer, and a dummy load, and compensates a delay time of the substantial external clock signal 'ECK' by the clock buffer, output buffer, and load circuit, etc.

The phase comparing part 240 according to one embodiment can be configured to receive a feedback clock signal 'fbCLK' and a reference clock signal 'refCLK' and generate a shift control signal '01' and a clock cycle transition detecting signal '02'.

To be more detailed, the phase comparing part 240 can be configured to generate the shift control signal '01' by comparing the phase differences of the feedback clock signal 'fbCLK' and the reference clock signal 'refCLK'. Further, the phase comparing part 240 can be configured to generate the clock cycle transition detecting signal '02' for detecting an error from the cycle of the external clock signal 'ECK' or the reference clock signal 'refCLK' by comparing the signals generated by delaying the feedback clock signal 'fbCLK' and the reference clock signal 'refCLK' with the phases of the feedback clock signal 'fbCLK' and the reference clock signal 'refCLK'. As the clock cycle transition detecting signal '02' is fed back to the DLL controller (100 in FIG. 1), it is determined whether to activate the DLL activating signal 'EN'.

Further, the shift register 250 can be configured to receive the shift control signal '01' and the DLL activating signal 'EN' and generate a control signal in response to an update clock signal 'UP_CLK'. The shift register 250 can be controlled to be activated or not depending on the level of the DLL activating signal 'EN'. Therefore, when receiving an activated, e.g., high-level DLL activating signal 'EN', the shift register 250 can shift the update clock signal 'UP_CLK' to the left or right through the delay line 220 according to the shift control signal '01'. Accordingly, it is possible to synchronize the phases of the reference clock signal 'refCLK' with the feedback clock signal 'fbCLK'. Depending on the implementation, for example, the shift register 250 can be a circuit, including a common flip flop.

A signal output from the shift register 250 can be input again to the delay line 220 and this loop can be repeated until the phases of the external clock signal 'ECLK' and the internal clock signal 'iCLK' are synchronized and locked. For example, the loop may be repeated hundreds of times.

The internal cock 'iCLK' with the phase synchronization may be provided as a final output clock signal 'DLL_CLK' through a driver 260.

Further, the semiconductor integrated circuit can be configured to include the update clock generator 270. The update clock generator 270 can be configured to receive a reference clock signal 'refCLK' and can generate an update clock signal 'UP_CLK' having a predetermined cycle. The update clock generator 270 can be a kind of time scheduler, but is not limited thereto. That is, the update clock generator 270 can be any kind of circuit that continually generates an update clock signal 'UP_CLK' for each predetermined time in a predetermined cycle such that the DLL output clock signal can be periodically updated even in the power down mode.

Figure 3:
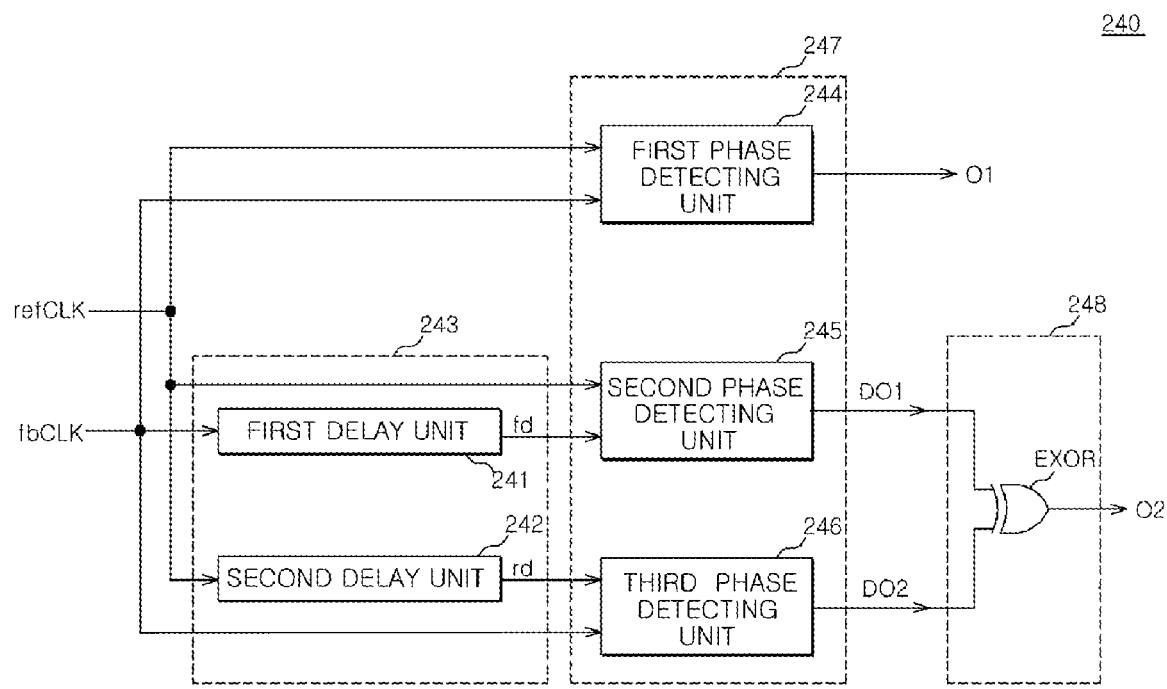
FIG. 3 is a block diagram of the phase comparing part included in the block diagram illustrating in detail the DLL block of FIG. 2.

FIG. 3 is a block diagram of the phase comparing part 240 shown in FIG. 2. Referring to FIG. 3, the phase comparing part 240 can be configured to include a delay part 243 and a phase detecting part 247.

The delay part 243 can include first and second delay units 241, 242.

The first delay unit 241 can be configured to generate a delayed feedback clock signal 'fd' by delaying the feedback clock signal 'fbCLK' for a predetermined time.

The second delay unit 242 can be configured to generate a delayed reference clock signal 'rd' by delaying the reference clock signal 'refCLK' for a predetermined time.

The predetermined delay time of the first and second delay units 241, 242 should be within a permissible range of cycle change of the external clock signal 'ECK'. In other words, the allowable range of the phase difference of the external clock signal 'ECK' should be within a range in which the feedback clock signal 'fbCLK' can be synchronized, for appropriate locking. Accordingly, the first and second delay units 241, 242 can be configured to detect phase differences when the phase difference is above the allowable level of cycle change of the external clock signal 'ECK'. Therefore, the first and second delay units 241, 242 have a delay time within a predetermined allowable range of change of the cycle of the external clock signal 'ECK'.

The phase detecting part 247 can be configured to include first to third phase detecting units 244, 245, 246.

The phase detecting part 247 can be configured to detect an error in the phase by comparing the reference clock signal 'refCLK' with the feedback clock signal 'fbCLK', or a delayed reference clock signal 'rd' with delayed feedback clock signal 'fd' that are obtained by delaying the reference clock signal 'refCLK' with the feedback clock signal 'fbCLK'.

First, the first phase detecting unit 244 can be configured to receive the reference clock signal 'refCLK' and the feedback clock signal 'fbCLK' and can be configured to generate the shift control signal '01'. The first phase detecting unit 244 can be a common phase comparing unit or a phase detecting unit, which is well known and will not be described in detail here. That is, the first phase detecting unit 244 can be configured to compare the reference clock signal 'refCLK' with the feedback clock signal 'fbCLK' that have not been delayed.

In detail, the first phase detecting unit 244 can be configured to compare the rising edge of the feedback clock signal 'fbCLK' with the rising edge of the reference clock signal 'refCLK'. For example, the first phase detecting unit 244 can be configured to determine whether the rising edge of the feedback clock signal 'fbCLK' leads the rising edge of the reference clock signal 'refCLK'. In other words, when the phase of the reference clock signal 'refCLK' is detected at the rising edge of the feedback clock signal 'fbCLK' and has a high level, it is considered that the feedback clock signal 'fbCLK' is delayed more than the reference clock signal 'refCLK'. Therefore, for example, a low-level shift control signal '01' can be generated. Thereafter, it is possible to control the shift register (250 in FIG. 2) to use the left shifting by the low-level shift control signal '01'.

When the phase of the reference clock signal 'refCLK' is detected at the rising edge of the feedback clock signal 'fbCLK' and has a low level, it is considered that the feedback clock signal 'fbCLK' leads the reference clock signal 'refCLK'. Therefore, for example, a high-level shift control signal '01' can be generated. Thereafter, it is possible to control the shift register (250 in FIG. 2) to use the left shifting by the high-level shift control signal '01'.

The second and third phase detecting units 245, 246 can be configured to detect an error in the cycle of the external clock signal 'ECK' or the reference clock signal 'refCLK'.

The second phase detecting unit 245 can be configured to receive the reference clock signal 'refCLK' and the delayed feedback clock signal 'fb' and can be configured to generate a first detecting signal D'01'.

The third phase detecting unit 246 can be configured to receive the delayed reference clock signal 'rd' and the feedback clock signal 'fbCLK' and can be configured to generate a second detecting signal 'D02'.

The operational principle of the second and third phase detecting units 245, 246 can be the same as that of the first phase detecting unit 244.

That is, the second phase detecting unit 245 can be configured to detect the phase of the reference clock signal 'refCLK' at the rising edge of the delayed feedback clock signal 'fd' and can be configured to generate the first detecting signal D'01'.

In the same way, the third phase detecting unit 246 can be configured to detect the phase of the delayed reference clock signal 'rd' at the rising edge of the feedback clock signal 'fd' and can be configured to generate the second detecting signal 'D02'.

A comparing part 248 can be configured to determine whether the levels of the first and second detecting signals D'01', 'D02' that have been separately generated, and can be configured to generate the clock cycle transition detecting signal '02'.

As described above, the delayed feedback clock signal 'fd' can be a signal obtained by delaying the feedback clock signal 'fbCLK' for a corresponding delay time within the allowable range of change of clock cycle. Similarly, the delayed reference clock signal 'rd' can be a signal obtained by delaying the reference clock signal 'refCLK' for a corresponding time within the allowable range of change of clock cycle.

First, it is described that the external clock signal 'ECK' can be received in a predetermined cycle within a predetermined range. In this case, an output signal obtained by detecting the phase of the reference clock signal 'refCLK' at the rising edge of the delayed feedback clock signal 'fd' and an output signal obtained by detecting the phase of the delayed reference clock signal 'rd' at the rising of the feedback clock signal 'fbCLK' are different as a matter of course.

On the contrary, it is described that the external clock signal 'ECK' can be received out of the predetermined range. In this case, an output signal obtained by detecting the phase difference of the reference clock signal 'CLK' at the rising edge of the delayed feedback clock signal 'fd' and an output signal obtained by detecting the phase difference of the delayed reference clock signal 'rd' at the rising edge of the feedback clock signal 'fbCLK' are the same. That is, when the cycle of the external clock signal 'ECK' is more than a predetermined time (or cycle), even if the reference signal and the signal of the object to be detected, which are generated in the range, are delayed and compared, it is difficult to verify the difference of the signals.

As described above, by comparing the phase difference of the signal that are delayed for a predetermined time (e.g. delayed feedback clock signal or delayed reference clock signal) with the reference signal that is not delayed (e.g. reference clock signal or feedback clock signal), it is possible to detect transition of cycle of the external clock signal 'ECK' inputted at an abnormal cycle.

Figure 4A:
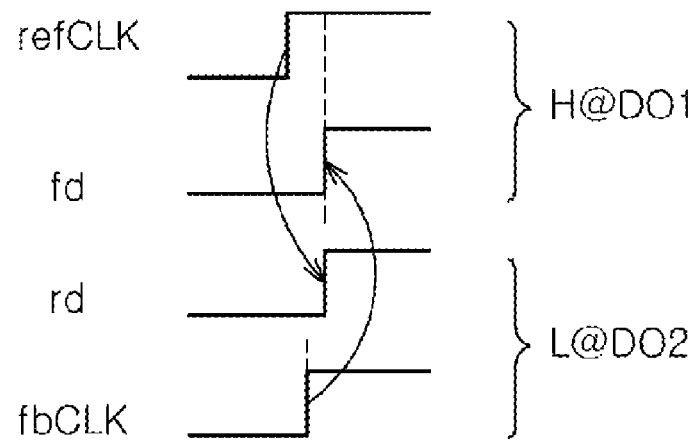
FIGS. 4A and 4B are timing diagrams illustrating the operation of the second and the third phase detecting unit included in the block diagram of the phase comparing part of FIG. 3.
Figure 4B:
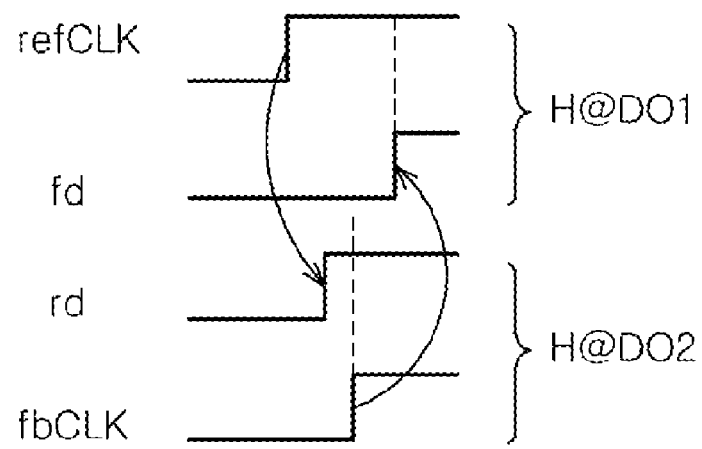

This is continued in detail with reference to FIGS. 4A and 4B.

FIG. 4A is a timing diagram illustrating the situation where the phase difference of the reference clock signal 'refCLK' and feedback clock signal 'fbCLK' is small and FIG. 4B is a timing diagram when the phase difference of the reference clock signal 'refCLK' and feedback clock signal 'fbCLK' is large.

The operation of the phase comparing part 240 is described with reference to FIGS. 3 to 4B.

First a timing diagram will be described when the phase difference of the reference clock signal 'refCLK' and feedback clock signal 'fbCLK' is small ①. The phase of the reference clock signal 'refCLK' detected at the rising edge of the delayed feedback clock signal 'fd' by the second phase detecting unit 245 has a high level. Further, the phase of the delayed reference clock signal 'rd' detected at the rising edge of the feedback clock signal 'fbCLK' by the third phase detecting unit 246 has a low level. Therefore, the comparing part 248 can be configured to receive signals having different levels, such that it generates a high-level clock cycle transition detecting signal '02', which means that the reference clock signal 'refCLK' (or the external clock signal 'ECK') is provided in a predetermined cycle within a range of change of clock signal.

Next a timing diagram will be described when the phase difference of the reference clock signal 'refCLK' and the feedback clock signal 'fbCLK' is large ②. The phase of the reference clock signal 'refCLK' detected at the rising edge of the delayed feedback clock signal 'fd' by the second phase detecting unit 245 has a high level. Further, the phase of the delayed reference clock signal 'rd' detected at the rising edge of the feedback clock signal 'fbCLK' by the third phase detecting unit 246 also has a high level. Therefore, the comparing part 248 can be configured to receive signal both having a high level, such that it generates a low-level clock cycle transition detecting signal '02', which means that the reference clock signal 'refCLK' (or external clock signal 'ECK') is out of a predetermined range of change of clock signal; therefore, updating the clock signal can be stopped at the entry of the power down mode.

Figure 5:
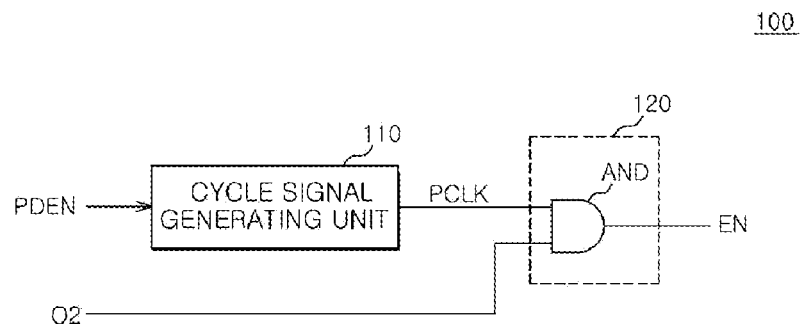
FIG. 5 is a block diagram of a DLL controller included in the block diagram of a semiconductor integrated circuit of FIG. 1.

FIG. 5 is a block diagram of the DLL controller 100 shown in FIG. 1.

Referring to FIG. 5, the DLL controller 100 according to one embodiment can be configured to include a cycle signal generating unit 110 and a signal combining unit 120.

The cycle signal generating unit 110 can be configured to generate a power down cycle clock signal 'PCLK' in response to a power down mode signal 'PDEN'. The power down cycle clock signal 'PCLK' can be a cycle signal that is generated in a predetermined cycle while the power down mode signal 'PDEN' is activated. The power down cycle clock signal 'PCLK' can be a signal that activates the updating of clock signal at the entry of the power down mode.

The signal combining unit 120 can be configured to combine the power down cycle clock signal 'PCLK' with the clock cycle transition detecting signal '02' and can be configured to generate a DLL activating signal 'EN'.

That is, the signal combining unit 120 can be configured to determine whether to provide the power down cycle clock signal 'PCLK' as an effective signal under the control of the clock cycle transition detecting signal '02'. The signal combining unit 120 can be configured to include a logical product gate AND. However, the signal combining unit 120 is not limited thereto and can be any circuit that can be provided with the power down cycle clock signal 'PCLK' as an effective DLL activating signal 'EN' by the activated clock cycle transition detecting signal '02'.

Figure 6:
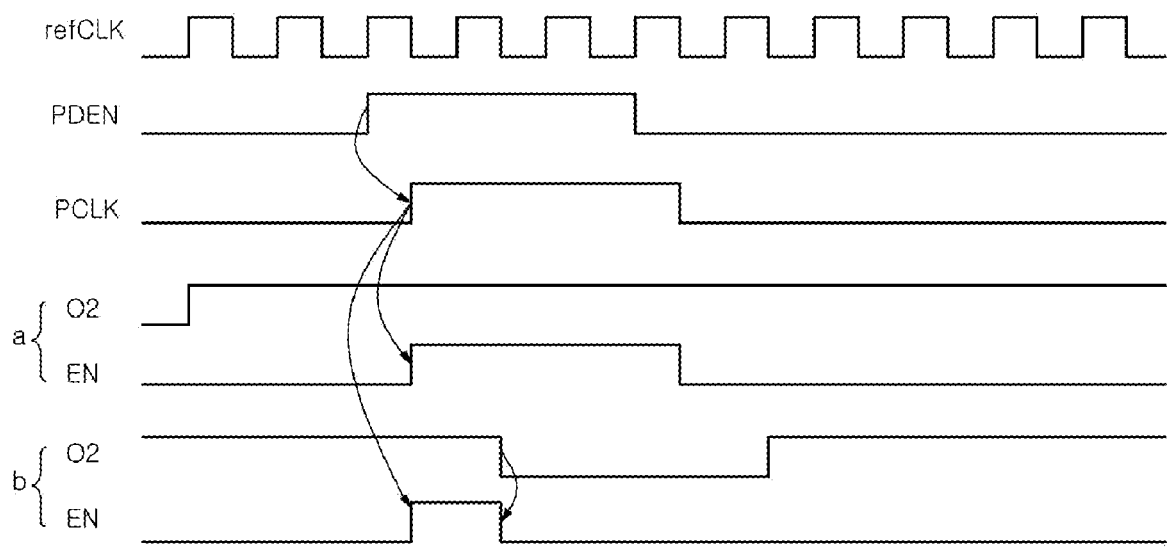
FIG. 6 is a timing diagram illustrating the operation of the DLL controller included in the block diagram of a DLL controller of FIG. 5.

FIG. 6 is a timing diagram illustrating when the DLL activating signal 'EN' according to FIG. 5 is generated.

Referring to FIG. 6, the reference clock signal 'refCLK' can be received in a predetermined cycle.

After starting the power down mode, the power down mode signal 'PDEN' is activated and the power down cycle clock signal 'PCLK' having a predetermined cycle is correspondingly generated. The predetermined cycle may be a cycle that is intermittently activated, in consideration of the power down mode.

On the other hand, as indicated by 'a', when the clock cycle transition detecting signal '02' is activated and has a high level, the power down cycle clock signal 'PCLK' can be provided as an effective DLL activating signal 'EN'. Accordingly, shifting the update clock signal 'UP_CLK' of the shift register (250 in FIG. 1) is activated and the clock signal of the DLL circuit is updated.

On the contrary, in the case indicated by 'b', the clock cycle transition detecting signal '02' has a low level, which means that the external clock signal 'ECK' or the reference clock signal 'refCLK' is received in a cycle over a predetermined range of change. Therefore, updating the DLL block (200 in FIG. 1) should be stopped. The DLL activating signal 'EN' is triggered to a non-activated low level of the clock cycle transition detecting signal '02' and becomes a low level. Accordingly, it is possible to non-activate the shifting of the update clock signal 'UP_CLK' in the shift register 250.

As described above, according to an embodiment of the invention, the DLL circuit is updated in a predetermined cycle at entry of the power down mode, in which the phase of the external clock signal is detected and it is detected whether a signal is out of a predetermined range of cycle. Therefore, when an external clock signal that is out of the predetermined range of cycle is received, an instant error of an external clock signal can be detected at the power down mode. Accordingly, it is possible to prevent a delay locked clock signal, as wrong external clock signal information, from being generated by stopping the update of the DLL circuit. Further, it is possible to improve the stability of the circuit by preventing malfunction due to errors of the clock signal.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit comprising:
   a DLL controller configured to deactivate a DLL block during a power down mode when a phase change of an external clock signal exceeds a predetermined range; and
   the DLL block configured to provide a result of comparing a reference clock signal with a feedback clock signal to the DLL controller and also to provide a delay locked clock signal that is periodically updated, in response to the reference clock signal, under the control of an activated output signal from the DLL controller,
   wherein the deactivated DLL block stops an update-operation that provides the delay locked clock signal that is periodically updated during the power down mode.

2. The semiconductor integrated circuit of claim 1, wherein the phase comparing unit includes:
   a delay part configured to generate a delayed feedback clock signal and a delayed reference clock signal by delaying the feedback clock signal and the reference clock signal, respectively, for the same predetermined time;
   a phase detecting part configured to detect phase differences of the reference clock signal, the feedback clock signal, the delayed reference clock signal, and the delayed feedback clock signal, and to generate the shift control signal and first and second detecting signals; and
   a comparing part configured to compare the first and second detecting signals.

3. The semiconductor integrated circuit of claim 2, wherein the predetermined delay time is within a predetermined range of phase change of the external clock signal.

4. The semiconductor integrated circuit of claim 2, wherein the phase detecting part includes:
   a first phase detecting unit configured to detect a phase difference of the reference clock signal and the feedback clock signal and generate the shift control signal;
   a second phase detecting unit configured to detect a phase difference of the reference clock signal and the delayed feedback clock signal and generate the first detecting signal; and
   a third phase detecting unit configured to detect a phase difference of the delayed reference clock signal and the feedback clock signal and generate the second detecting signal.

5. The semiconductor integrated circuit of claim 2, wherein the comparing part configured to generate an activated clock cycle transition detecting signal when levels of the first and second detecting signals are the same.

6. The semiconductor integrated circuit of claim 1, wherein the DLL controller includes:
   a cycle signal generating unit configured to generate a power down cycle clock signal at the entry of a power down mode; and
   a signal combining unit configured to combine a comparing signal, which is obtained by comparing the reference clock signal with the feedback clock signal, with the power down cycle clock signal, and provide the DLL activating signal.

7. The semiconductor integrated circuit of claim 6, wherein the DLL activating signal that is activated is provided when a range of phase change of the external clock signal is within a predetermined range after the comparing.

8. A semiconductor integrated circuit comprising:
   a DLL controller configured to receive a clock cycle transition detecting signal for detecting a range of phase change of an external clock signal at the entry of a power down mode, and provide a DLL activating signal; and
   a DLL block configured to generate the clock cycle transition detecting signal by comparing a phase difference of signals obtained by delaying for a predetermined time a reference clock signal buffered from the external clock signal and a feedback clock signal obtained by delaying the reference clock signal, and provide a delay locked clock signal that is periodically updated in response to the external clock signal according to the level of the DLL activating signal,
   wherein the DLL controller includes:
      a cycle signal generating unit configured to generate a power down cycle clock signal at the entry of a power down mode; and
      a signal combining unit configured to combines the clock cycle transition detecting signal with the power down cycle clock signal and provide the DLL activating signal.

9. The semiconductor integrated circuit of claim 8, wherein the DLL block includes:
   a phase comparing part configured to receive the reference clock signal and the feedback clock signal and generate a shift control signal and the clock cycle transition detecting signal; and
   a shift register that is controlled by the DLL activating signal and is configured to generate a control signal in response to an update clock signal that is generated in a predetermined cycle.

10. The semiconductor integrated circuit of claim 9, wherein the phase comparing part includes:
   a delay part configured to generate a delayed feedback clock signal and a delayed reference clock signal by delaying the feedback clock signal and the reference clock signal, respectively, for the same predetermined time;
   a phase detecting part configured to detect phase differences of the reference clock signal, the feedback clock signal, the delayed reference clock signal, and the delayed feedback clock signal, and generate the shift control signal and first and second detecting signals; and
   a comparing part configured to compare the first and second detecting signals.

11. The semiconductor integrated circuit of claim 10, wherein the predetermined delay time is within a predetermined range of phase change of the external clock signal.

12. The semiconductor integrated circuit of claim 10, wherein the phase detecting part includes:
   a first phase detecting unit configured to detect a phase difference of the reference clock signal and the feedback clock signal and generates the shift control signal;
   a second phase detecting unit configured to detect a phase difference of the reference clock signal and the delayed feedback clock signal and generate the first detecting signal; and
   a third phase detecting unit configured to detect a phase difference of the delayed reference clock signal and the feedback clock signal and generate the second detecting signal.

13. The semiconductor integrated circuit of claim 10, wherein the comparing part configured to generate the clock cycle transition detecting signal, which is activated, when levels of the first and second detecting signals are the same.

14. The semiconductor integrated circuit of claim 8, wherein the DLL controller configured to provide the DLL activating signal, which is activated, when receiving the clock cycle transition detecting signal that is activated.

* * * * *